(12) United States Patent
Mullee et al.

(10) Patent No.: US 6,500,605 B1
(45) Date of Patent: Dec. 31, 2002

(54) REMOVAL OF PHOTORESIST AND RESIDUE FROM SUBSTRATE USING SUPERCRITICAL CARBON DIOXIDE PROCESS

(75) Inventors: William H. Mullee, Portland, OR (US); Maximilian A. Biberger, Palo Alto, CA (US); Paul E. Schilling, Granite Bay, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/697,227

(22) Filed: Oct. 25, 2000

Related U.S. Application Data

(63) Continuation-in-part of application No. 09/389,788, filed on Sep. 3, 1999, which is a continuation of application No. 09/085,391, filed on May 27, 1998.
(60) Provisional application No. 60/047,739, filed on May 27, 1997, provisional application No. 60/163,116, filed on Nov. 2, 1999, provisional application No. 60/163,120, filed on Nov. 2, 1999, and provisional application No. 60/199,661, filed on Apr. 25, 2000.

(51) Int. Cl.$^7$ ................................................. G03F 7/42
(52) U.S. Cl. ........................ 430/329; 430/311; 430/331
(58) Field of Search ............................... 430/311, 322, 430/329, 331

(56) References Cited

U.S. PATENT DOCUMENTS

| | | | |
|---|---|---|---|
| 2,617,719 A | 11/1952 | Stewart | 23/312 |
| 3,890,176 A | 6/1975 | Bolon | 156/2 |
| 3,900,551 A | 8/1975 | Bardoncelli et al. | 423/9 |
| 4,029,517 A | 6/1977 | Rand | 134/11 |
| 4,091,643 A | 5/1978 | Zucchini | 68/18 |

(List continued on next page.)

FOREIGN PATENT DOCUMENTS

| | | | |
|---|---|---|---|
| EP | 0 283 740 A2 | 9/1988 | |
| EP | 0 391 035 | 10/1990 | |
| EP | 0 518 653 B1 | 12/1992 | ............. D06L/1/02 |
| EP | 0 536 752 A2 | 4/1993 | |
| EP | 0 572 913 A1 | 12/1993 | |
| EP | 0 620 270 A3 | 10/1994 | ............ C11D/7/50 |
| EP | 0 679 753 B1 | 11/1995 | ........... D06F/43/00 |
| EP | 0 711 864 B1 | 5/1996 | ............ D06G/1/00 |
| EP | 0 726 099 A2 | 8/1996 | |
| EP | 0 822 583 A2 | 2/1998 | ......... H01L/21/306 |

(List continued on next page.)

OTHER PUBLICATIONS

Guan, Z. et al., "Fluorocarbon–Based Heterophase Polymeric Materials. 1. Block Copolymer Surfactants for Carbon Dioxide Applications," Macromolecules, vol. 27, 1994, pp 5527–5532.

(List continued on next page.)

Primary Examiner—Kathleen Duda
(74) Attorney, Agent, or Firm—Haverstock & Owens LLP

(57) ABSTRACT

A method of removing photoresist and residue from a substrate begins by maintaining supercritical carbon dioxide, an amine, and a solvent in contact with the substrate so that the amine and the solvent at least partially dissolve the photoresist and the residue. Preferably, the amine is a tertiary amine. Preferably, the solvent is selected from the group consisting of DMSO, EC, NMP, acetyl acetone, BLO, acetic acid, DMAC, PC, and a mixture thereof. Next, the photoresist and the residue are removed from the vicinity of the substrate. Preferably, the method continues with a rinsing step in which the substrate is rinsed in the supercritical carbon dioxide and a rinse agent. Preferably, the rinse agent is selected from the group consisting of water, alcohol, a mixture thereof, and acetone. In an alternative embodiment, the amine and the solvent are replaced with an aqueous fluoride.

35 Claims, 10 Drawing Sheets

U.S. PATENT DOCUMENTS

| | | | |
|---|---|---|---|
| 4,219,333 A | 8/1980 | Harris | 8/137 |
| 4,341,592 A | 7/1982 | Shories et al. | 156/643 |
| 4,474,199 A | 10/1984 | Blaudszun | 134/105 |
| 4,475,993 A | 10/1984 | Blander et al. | 204/64 T |
| 4,601,181 A | 7/1986 | Privat | 68/18 |
| 4,693,777 A | 9/1987 | Hazano et al. | 156/345 |
| 4,749,440 A | 6/1988 | Blackwood et al. | 156/646 |
| 4,788,043 A | 11/1988 | Kagiyama et al. | 422/292 |
| 4,838,476 A | 6/1989 | Rahn | 228/180.1 |
| 4,865,061 A | 9/1989 | Fowler et al. | 134/108 |
| 4,877,530 A | 10/1989 | Moses | 210/511 |
| 4,879,004 A | 11/1989 | Oesch et al. | 203/89 |
| 4,923,828 A | 5/1990 | Gluck et al. | 437/225 |
| 4,924,892 A | 5/1990 | Kiba et al. | 134/123 |
| 4,933,404 A | 6/1990 | Beckman et al. | 526/207 |
| 4,944,837 A | 7/1990 | Nishikawa et al. | 156/646 |
| 4,960,140 A | 10/1990 | Ishijima et al. | 134/31 |
| 4,983,223 A | 1/1991 | Gessner | 134/25.4 |
| 5,011,542 A | 4/1991 | Weil | 134/38 |
| 5,013,366 A | 5/1991 | Jackson et al. | 134/1 |
| 5,068,040 A | 11/1991 | Jackson | 210/748 |
| 5,105,556 A | 4/1992 | Kurokawa et al. | 34/12 |
| 5,143,103 A | 9/1992 | Basso et al. | 134/98.1 |
| 5,158,704 A | 10/1992 | Fulton et al. | 252/309 |
| 5,174,917 A | 12/1992 | Monzyk | 252/60 |
| 5,185,058 A | 2/1993 | Cathey, Jr. | 156/656 |
| 5,185,296 A | 2/1993 | Morita et al. | 437/229 |
| 5,193,560 A | 3/1993 | Tanaka et al. | 134/56 R |
| 5,201,960 A | 4/1993 | Starov | 134/11 |
| 5,213,619 A | 5/1993 | Jackson et al. | 134/1 |
| 5,215,592 A | 6/1993 | Jackson | 134/1 |
| 5,225,173 A | 7/1993 | Wai | 423/2 |
| 5,236,602 A | 8/1993 | Jackson | 210/748 |
| 5,237,824 A | 8/1993 | Pawliszyn | 62/51.1 |
| 5,238,671 A | 8/1993 | Matson et al. | 423/397 |
| 5,250,078 A | 10/1993 | Saus et al. | 8/475 |
| 5,261,965 A | 11/1993 | Moslehi | 134/1 |
| 5,266,205 A | 11/1993 | Fulton et al. | 210/639 |
| 5,267,455 A | 12/1993 | Dewees et al. | 68/5 |
| 5,269,815 A | 12/1993 | Schlenker et al. | 8/475 |
| 5,274,129 A | 12/1993 | Natale et al. | 549/349 |
| 5,288,333 A | 2/1994 | Tanaka et al. | 134/31 |
| 5,290,361 A | 3/1994 | Hayashida et al. | 134/2 |
| 5,294,261 A | 3/1994 | McDermott et al. | 134/7 |
| 5,298,032 A | 3/1994 | Schlenker et al. | 8/475 |
| 5,304,515 A | 4/1994 | Morita et al. | 437/231 |
| 5,306,350 A | 4/1994 | Hoy et al. | 134/22 |
| 5,312,882 A | 5/1994 | DeSimone et al. | 526/201 |
| 5,313,965 A | 5/1994 | Palen | 134/61 |
| 5,316,591 A | 5/1994 | Chao et al. | 134/34 |
| 5,334,332 A | 8/1994 | Lee | 252/548 |
| 5,334,493 A | 8/1994 | Fujita et al. | 430/463 |
| 5,337,446 A | 8/1994 | Smith et al. | 15/21.1 |
| 5,339,844 A | 8/1994 | Stanford, Jr. et al. | 134/107 |
| 5,352,327 A | 10/1994 | Witowski | 156/646 |
| 5,355,901 A | 10/1994 | Mielnik et al. | 134/105 |
| 5,356,538 A | 10/1994 | Wai et al. | 210/634 |
| 5,364,497 A | 11/1994 | Chau et al. | 156/645 |
| 5,368,171 A | 11/1994 | Jackson | 134/147 |
| 5,370,740 A | 12/1994 | Chao et al. | 134/1 |
| 5,370,742 A | 12/1994 | Mitchell et al. | 134/10 |
| 5,377,705 A | 1/1995 | Smith, Jr. et al. | 134/95.3 |
| 5,401,322 A | 3/1995 | Marshall | 134/1 |
| 5,403,621 A | 4/1995 | Jackson et al. | 427/255.1 |
| 5,403,665 A | 4/1995 | Alley et al. | 428/447 |
| 5,412,958 A | 5/1995 | Iliff et al. | 68/5 |
| 5,417,768 A | 5/1995 | Smith, Jr. et al. | 134/10 |
| 5,456,759 A | 10/1995 | Stanford, Jr. et al. | 134/1 |
| 5,470,393 A | 11/1995 | Fukazawa | 134/3 |
| 5,474,812 A | 12/1995 | Truckenmuller et al. | 427/430.1 |
| 5,482,564 A | 1/1996 | Douglas et al. | 134/18 |
| 5,486,212 A | 1/1996 | Mitchell et al. | 8/142 |
| 5,494,526 A | 2/1996 | Paranjpe | 134/1 |
| 5,500,081 A | 3/1996 | Bergman | 156/646.1 |
| 5,501,761 A | 3/1996 | Evans et al. | 156/344 |
| 5,505,219 A | 4/1996 | Lansberry et al. | 134/105 |
| 5,509,431 A | 4/1996 | Smith, Jr. et al. | 134/95.1 |
| 5,514,220 A | 5/1996 | Wetmore et al. | 134/22.18 |
| 5,522,938 A | 6/1996 | O'Brien | 134/1 |
| 5,526,834 A | 6/1996 | Mielnik et al. | 134/105 |
| 5,533,538 A | 7/1996 | Marshall | 134/104.4 |
| 5,547,774 A | 8/1996 | Gimzewski et al. | 428/694 |
| 5,550,211 A | 8/1996 | DeCrosta et al. | 528/480 |
| 5,580,846 A | 12/1996 | Hayashida et al. | 510/175 |
| 5,589,082 A | 12/1996 | Lin et al. | 216/2 |
| 5,589,105 A | 12/1996 | DeSimone et al. | 252/351 |
| 5,629,918 A | 5/1997 | Ho et al. | 369/112 |
| 5,632,847 A | 5/1997 | Ohno et al. | 156/344 |
| 5,635,463 A | 6/1997 | Muraoka | 510/175 |
| 5,637,151 A | 6/1997 | Schulz | 134/2 |
| 5,641,887 A | 6/1997 | Beckman et al. | 546/26.2 |
| 5,656,097 A | 8/1997 | Olesen et al. | 134/1 |
| 5,665,527 A | 9/1997 | Allen et al. | 430/325 |
| 5,669,251 A | 9/1997 | Townsend et al. | 68/58 |
| 5,676,705 A | 10/1997 | Jureller et al. | 8/142 |
| 5,679,169 A | 10/1997 | Gonzales et al. | 134/1.3 |
| 5,679,171 A | 10/1997 | Saga et al. | 134/3 |
| 5,683,473 A | 11/1997 | Jureller et al. | 8/142 |
| 5,683,977 A | 11/1997 | Jureller et al. | 510/286 |
| 5,688,879 A | 11/1997 | DeSimone | 526/89 |
| 5,700,379 A | 12/1997 | Biebl | 216/2 |
| 5,726,211 A | 3/1998 | Hedrick et al. | 521/61 |
| 5,730,874 A | 3/1998 | Wai et al. | 210/638 |
| 5,739,223 A | 4/1998 | DeSimone | 526/89 |
| 5,783,082 A | 7/1998 | DeSimone et al. | 210/634 |
| 5,797,719 A | 8/1998 | James et al. | 417/46 |
| 5,798,438 A | 8/1998 | Sawan et al. | 528/483 |
| 5,804,607 A | 9/1998 | Hedrick et al. | 521/64 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,872,257 A | 2/1999 | Beckman et al. | 546/336 |
| 5,873,948 A | 2/1999 | Kim | 134/19 |
| 5,881,577 A | 3/1999 | Sauer et al. | 68/5 |
| 5,888,050 A | 3/1999 | Fitzgerald et al. | 417/46 |
| 5,900,354 A | 5/1999 | Batchelder | 430/395 |
| 5,908,510 A | 6/1999 | McCullough et al. | 134/2 |
| 5,932,100 A | 8/1999 | Yager et al. | 210/634 |
| 5,944,996 A | 8/1999 | DeSimone et al. | 210/634 |
| 5,965,025 A | 10/1999 | Wai et al. | 210/634 |
| 5,976,264 A | 11/1999 | McCullough et al. | 134/2 |
| 5,980,648 A | 11/1999 | Adler | 134/34 |
| 6,017,820 A | 1/2000 | Ting et al. | 438/689 |
| 6,024,801 A | 2/2000 | Wallace et al. | 134/1 |
| 6,114,044 A | 9/2000 | Houston et al. | 428/447 |
| 6,149,828 A | 11/2000 | Vaarststra | 216/57 |
| 6,242,165 B1 | 6/2001 | Vaarststra | 430/329 |

FOREIGN PATENT DOCUMENTS

| | | | |
|---|---|---|---|
| EP | 0 829 312 A2 | 3/1998 | B08B/3/08 |
| EP | 0 836 895 A2 | 4/1998 | |
| JP | 60-192333 | 9/1985 | |
| JP | 1045131 | 2/1989 | |
| JP | 2-209729 | 8/1990 | H01L/21/302 |
| JP | 8222508 | 8/1996 | |
| WO | WO 90/06189 | 6/1990 | |
| WO | WO 90/13675 | 11/1990 | |
| WO | WO 93/14255 | 7/1993 | D06B/5/16 |
| WO | WO 93/14259 | 7/1993 | D06M/11/76 |
| WO | WO 93/20116 | 10/1993 | C08F/14/18 |
| WO | WO 96/27704 | 9/1996 | D06L/1/00 |

WO    WO 99/49998    10/1999

OTHER PUBLICATIONS

International Journal of Environmentally Conscious Design & Manufacturing, vol. 2, No. 1, 1993, p. 83.

Journal of the American Ceramic Society, vol. 72, No. 6, pp. 872–874.

Ziger, D.H. et al., "Compressed Fluid Technology: Application to RIE Developed Resists," AIChE Journal, vol. 33, No. 10, Oct. 1987, pp 1585–1591.

Kirk–Othmer, "Encyclopedia of Chemical Terminology," 3rd ed., Supplement Volume, "Alcohol Fuels to Toxicology," 1984, pp. 872–893.

"Cleaning with Supercritical $CO_2$," NASA Tech Briefs, MFS–29611, Marshall Space Flight Center, Alabama, Mar. 1979.

Basta, N., "Supercritical Fluids: Still Seeking Acceptance," Chemical Engineering, vol. 92, No. 3, Feb. 24, 1985, 14.

Takahashi, D., "Los Alamos Lab finds way to cut chip waste," Wall Street Journal, Jun. 22, 1998.

Supercritical CO, process offers less mess from semiconductor plants, Chemical Engineering Magazine, pp. 27 & 29, Jul. 1998.

Sun, Y.P. et al., "Preparation of polymer–protected semiconductor nanoparticles through the rapid expansion of supercritical fluid solution," Chemical Physics Letters, pp. 585–588, May 22, 1998.

Jackson, K. et al., "Surfactants and Micromulsions in Supercritical Fluids" in "Supercritical Fluid Cleaning." Noyes Publications, Westwood, NJ, pp. 87–120, Spring 1998.

Kryszewski, M., "Production of Metal and Semiconductor Nanoparticles in Polymer Systems," Polymeri, pp. 65–73, Feb. 1998.

Bakker, G.L. et al., "Surface Cleaning and Carbonaceous Film Removal Using High Pressure, High Temperature Water, and Water/CO2 Mixtures," J. Electrochem, Soc, vol. 145, No. 1, pp. 284–291, Jan. 98.

Ober, C.K. et al., "Imaging polymers with supercritical carbon dioxide," Advanced Materials, vol. 9, No. 13, 99. 1039–1043, Nov. 3, 1997.

Russick, E.M. et al., "Supercritical carbon dioxide extraction of solvent from micromachined structures." Supercritical Fluids Extraction and Pollution Prevention, ACS Symposium Series, vol. 670, pp. 255–269, Oct. 21, 1997.

Dahmen, N. et al., Supercritical fluid extraction of grinding and metal cutting waste contaminated with the oils, Supercritical Fluids—Extraction and Pollution Prevention, ACS Symposium Series, vol. 670, pp. 270–279, Oct. 21, 1997.

Wai, C.M., "Supercritical fluid extraction: metals as complexes," J. Chromatography A, vol. 785, pp. 369–383, Oct. 17, 1997.

Xu, C. et al., Submicron–sized spherical yttrium oxide based phosphors prepared by supercritical CO2–assisted aerosolization and pyrolysis, Appl. Phys. Lett., vol. 71, No. 12, Sep. 22, 1997.

Tomioka Y. et al., "Decomposition of tetramethylammonium (TMA) in a positive photoresist developer by supercritical water," Abstracts of Papers 214th ACS Natl Meeting, American Chemical Society, Abstract No. 108, Sep. 7, 1997.

Klein, H. et al., "Cyclic organic carbonates serve as solvents and reactive diluents," Coatings Worlds, pp. 38–40, May 1997.

Buhler, J. et al., Liner array of complementary metal oxide semiconductor double–pass metal micromirrors, Opt. Eng., vol. 36, No. 5, pp 1391–1398, May 1997.

Jo, M.H. et al., Evaluation of SIO2 aerogel thin film with ultra low dielectric constant as an intermetal dielectric, Microelectronic Engineering, vol. 33, pp. 343–348, Jan. 1997.

McClain, J.B. et al., "Design of Nonionic Surfactants for supercritical carbon dioxide," Science, vol. 27, Dec. 20, 1996.

Znaidi, L. et al., "Batch and semi–continuous synthesis of magnesium oxide powders from hydrolysis and supercritical treatment of Mg(OCH3)2," Materials Research Bulletin, vol. 31, No. 12, pp. 1527–1335, Dec. 1996.

Tadros, M.E., "Synthesis of titanium dioxide particles in supercritical CO2" J. Supercritical Fluids, vol. 9, No. 3, pp. 172–176, Sep. 1996.

Courtecuisse, V.G. et al., "Kinetics of the titanium isopropoxide decomposition in supercritical isopropyl alcohol," ind. Eng. Chem. Res., vol. 35, No. 8, pp. 2539–2545, Aug. 1996.

Gabor, A. et al., "Block and random copolymer resists designed for 193 nm lithography and environmentally friendly supercritical CO2 Development," Dept. Mat. Sci. & Eng. Cornell Univ., SPIE, vol. 2724, pp. 410–417, Jun. 1995.

Schimek, G. L. et al., "Supercritical ammonium synthesis and charaterization of four new alkali metal silver antimony sulfides . . . ," J. Solid State Chemistry, vol. 123 pp. 277–284, May 1996.

Gallagher–Wetmore, P. et al., "Supercritical fluid processing: Opportunities for new resist materials and processes," IBM research Division, SPIE, vol. 2725, pp. 289–299, Apr. 1996.

Papathomas, K.J. et al., "Debonding of photoresists by organic solvents," J. Applied Polymer Science, vol. 59, pp. 2029–2037, Mar. 28, 1996.

Watkins, J.J. et al., "Polymer/metal nanocomposite synthesis in supercritical CO2," Chemistry of Materials, vol. 7, No. 11, Nov. 1995.

Gloyna, E.F. et al., "Supercritical water oxidation research and development update," Environment Progess, vol. 14, No. 3, pp. 182–192, Aug. 1995.

Gallagher–Wetmore, P. et al., Supercritical fluid processing: A new dry technique for photoresist developing, IBM Research Division, SPIE vol. 2438, pp. 694–708, Jun. 1995.

Gabor, A. H. et al., "Silicon–containing block copolymer resist materials" Microelectronics Technology—Polymers for Advanced Imaging and Packaging, ACS Symposium Series, vol. 614, pp. 281–298, Apr. 1995.

Tsiartas, P.C. et al., "Effect of molecular weight distribution on the dissolution properties of novolac blends," SPIE, vol. 2438, pp. 264–271, 1995.

Allen, R.D. et al., "Performance properties of near–monodisperse novolak resins,"SPIE, vol. 2438, pp. 250–260, 1995.

Wood, P.T. et al., "Synthesis of new channeled structures in supercritical amines . . . , " Inorg. Chem., vol. 33, pp. 1556–1558, 1994.

Jerome, J.E. et al., "Synthesis of new low–dimensional quaternary compounds . . . ," Inorg. Chem, vol. 33, 1733–1734, 1994.

McHardy, J. et al., "Progress in supercritical CO2 cleaning," SAMPE Jour., vol. 29, No. 5, pp. 20–27, Sep. 1993.

Purtell, R, et al., "Precision parts cleaning using supercritical fluids," J. Vac, Sci, Technol. A. vol. 11, No. 4, Jul. 1993.

Bok, E. et al., "Supercritical fluids for single wafer cleaning," Solids State Technology, pp. 117–120, Jun. 1992.

Adschiri, T. et al., "Rapid and continuous hydrothermal crystallization of metal oxide particles in supercritical water," J. Am. Ceram. Soc., vol. 75, No. 4, pp. 1019–1022, 1992.

Hansen, B.N. et al., "Supercritical fluid transport—chemical deposition of films," Chem. Mater., vol. 4, No. 4, pp. 749–752, 1992.

Page, S.H. et al., "Predictability and effect of phase behavior of CO2/ propylene carbonate in supercritical fluid chromatography," J. Microl. Sep., vol. 3, No. 4, pp. 355369, 1991.

Brokamp, T. et al., "Synthese und Kristallstruktur eines gemischivalenten Lithium–Tantainirids Li2Ta3Ns," J. Alloys and Compounds, vol. 176. pp. 47–60, 1991.

Hybertson, B.M. et al., "Deposition of palladium films by a novel supercritical fluid transport chemical deposition process," Mat. Res. Bull., vol. 26, pp. 1127–1133, 1991.

Ziger, D. H. et al., "Compressed fluid technology: Application to RIE–Developed resists," AiChE Jour., vol. 33, No. 10, pp. 1585–1591, Oct. 1987.

Matson, D.W. et al., "Rapid expansion of supercritical fluid solutions: Solute formation of powders, thin films, and fibers," Ind. Eng. Chem. Res., vol. 26, No. 11, pp. 2298–2306, 1987.

Tolley, W.K. et al., "Stripping organics from metal and mineral surfaces using supercritical fluids," Separation Sciences and Technology, vol. 22, pp. 1087–1101, 1987.

"Final report on the safety assessment of propylene carbonate," J. American College of Toxicology, vol. 6, No. 1, pp. 23–51.

US 6,500,605 B1

REMOVAL OF PHOTORESIST AND RESIDUE FROM SUBSTRATE USING SUPERCRITICAL CARBON DIOXIDE PROCESS

RELATED APPLICATIONS

This application is a continuation-in-part of co-pending U.S. application Ser. No. 09/389,788, filed Sep. 3, 1999, which is a continuation of co-pending U.S. application Ser. No. 09/085,391, filed May 27, 1998, which claims priority from U.S. Provisional Application No. 60/047,739, filed May 27, 1997, all of which are incorporated by reference.

This application also claims priority from U.S. Provisional Patent Application No. 60/163,116, filed on Nov. 2, 1999, U.S. Provisional Patent Application No. 60/163,120, filed on Nov. 2, 1999, and U.S. Provisional Patent Application No. 60/199,661, filed on Apr. 25, 2000, all of which are incorporated by reference.

FIELD OF THE INVENTION

The present invention relates to the field of removal of photoresist and residue from a substrate. More particularly, the present invention relates to the field of removal of photoresist and residue from a substrate using supercritical carbon dioxide.

BACKGROUND OF THE INVENTION

Semiconductor fabrication uses photoresist in ion implantation, etching, and other processing steps. In the ion implantation steps, the photoresist masks areas of a semiconductor substrate that are not implanted with a dopant. In the etching steps, the photoresist masks areas of the semiconductor substrate that are not etched. Examples of the other processing steps include using the photoresist as a blanket protective coating of a processed wafer or the blanket protective coating of a MEMS (micro electromechanical system) device.

Following the ion implantation steps, the photoresist exhibits a hard outer crust covering a jelly-like core. The hard outer crust leads to difficulties in a photoresist removal.

Following the etching steps, remaining photoresist exhibits a hardened character that leads to difficulties in the photoresist removal. Following the etching steps, photoresist residue mixed with etch residue coats sidewalls of etch features. Depending on a type of etching step and material etched, the photoresist residue mixed with the etch residue presents a challenging removal problem since the photoresist residue mixed with the etch residue often strongly bond to the sidewalls of the etch features.

Typically, in the prior art, the photoresist and the photoresist residue are removed by plasma ashing in an $O_2$ plasma followed by stripping in a stripper bath.

FIG. 1 illustrates an n-p-n FET (field effect transistor) structure 10 subsequent to an ion implantation and prior to a photoresist removal. The n-p-n FET structure 10 includes a source region 12, a gate region 14, and a drain region 16 with isolation trenches 18 separating the n-p-n FET structure 10 from adjacent electronic devices. A first photoresist 20 masks all but the source and drain regions, 12 and 16. In the ion implantation, a high energy ion source implanted an n-dopant into the source and drain regions, 12 and 16. The high energy ion source also exposed the first photoresist 20 to the n-dopant which creates a hard crust on an upper surface 22 of the first photoresist 20. In the prior art, the first photoresist 20 is removed by the plasma ashing and the stripper bath of the prior art.

FIG. 2 illustrates a first via structure 30 of the prior art subsequent to an RIE (reactive ion etching) etch and prior to a photoresist and residue removal. The first via structure 30 includes a via 32 which is etched into a first $SiO_2$ layer 34 to a first TiN layer 36. In the first via structure 30, the via 32 stops at the first TiN layer 36 because the first TiN layer 36 provides an etch stop for the RIE etch of the first $SiO_2$ layer 34. Etching through the first TiN layer 36 complicates the RIE etch by requiring an additional etch chemistry for the first TiN layer 36; so for this particular etch, the TiN layer 36 is not etched. The first TiN layer 36 lies on a first Al layer 38, which lies on a first Ti layer 40. A first residue, which comprises photoresist residue 42 mixed with $SiO_2$ etch residue 44, coats sidewalls 46 of the via 32. Second photoresist 48 remains on an exposed surface 50 of the first $SiO_2$ layer 34. In the prior art, the second photoresist 48, the photoresist residue 42, and the $SiO_2$ etch residue 44 are removed using the plasma ashing and the stripper bath of the prior art.

Note that specific layer materials and specific structure described relative to the first via structure 30, and to other thin film structures discussed herein, are illustrative. Many other layer materials and other structures are commonly employed in semiconductor fabrication.

FIG. 3 illustrates a second via structure 60 of the prior art subsequent to the RIE etch and prior to the photoresist and residue removal. The second via structure 60 includes a second via 62 which is etched through the first $SiO_2$ layer 34 and the first TiN layer 36 to the first Al layer 38. By etching through the first TiN layer 36, a device performance is improved because a contact resistance with the first Al layer 38 is lower than the contact resistance with the first TiN layer 36. The second via structure 60 also includes the first Ti layer 40. The first residue, which comprises the photoresist residue 42 mixed with the $SiO_2$ etch residue 44, coats second sidewalls 64 of the second via 62. A second residue, which comprises the photoresist residue 42 mixed with TiN etch residue 66, coats the first residue. The second photoresist 48 remains on the exposed surface 50 of the first $SiO_2$ layer 34. In the prior art, the second photoresist 48, the photoresist residue 42, the $SiO_2$ etch residue 44, and the TiN etch residue 66 are removed using the plasma ashing and the stripper bath of the prior art.

Note that the first residue (FIGS. 2 and 3) and the second residue (FIG. 3) are worst case scenarios. Depending upon a specific etch process, the first residue or the second residue might not be present.

FIG. 4 illustrates a metal line structure 70 subsequent to a metal RIE etch and prior to a residue removal. The metal line structure 70 includes a second TiN layer 72 on a second Al layer 74 which is on a second Ti layer 76. The second TiN layer 72, the second Al layer 74, and the second Ti layer 76 form a metal line. The second Ti layer 76 contacts a W via 78, which in turn contacts the first Al layer 38. The W via 78 is separated from the first $SiO_2$ layer 34 by a sidewall barrier 80. A third residue, which comprises a halogen residue 82 mixed with metal etch residue 84, lies on the exposed surface 50 of the first $SiO_2$ layer 34. The third residue, which comprises the halogen residue 82 and the metal etch residue 84, also lies on a second exposed surface 86 of the second TiN layer 72. A fourth residue, which comprises a combination of the photoresist residue 42 mixed with metal etch residue 84, coats sides 88 of the metal line. Skirts 90 of the fourth residue extend above the second exposed surface 86 of the second TiN layer 72. In the prior art, the photoresist residue 42, the halogen residue 82, and the metal etch residue 84 are removed using the plasma ashing and the stripper bath of the prior art.

FIG. 5 illustrates a dual damascene structure 100 of the prior art subsequent to a dual damascene RIE etch and prior to the photoresist and photoresist residue removal. The dual damascene structure 100 includes a dual damascene line 102 formed above a dual damascene via 104. The dual damascene line 102 is etched through a second $SiO_2$ layer 106 and a first SiN layer 108. The dual damascene via 104 is etched through a third $SiO_2$ layer 110 and a second SiN layer 112. The dual damascene via is etched to an underlying Cu layer 114.

In processing subsequent to the photoresist and residue removal, exposed surfaces of the dual damascene line and via, 102 and 104, are coated with a barrier layer and then the dual damascene line and via, 102 and 104, are filled with Cu.

Returning to FIG. 5, a fifth residue, which comprises the photoresist residue 42 mixed with the $SiO_2$ etch residue 44, coats line sidewalls 116 and via sidewalls 118. A sixth residue, which comprises the photoresist residue 42 mixed with SiN etch residue 120, coats the fifth residue. A seventh residue, which comprises the photoresist residue 42 mixed with Cu etch residue 122, coats the sixth residue. The photoresist 48 remains on a second exposed surface of the second $SiO_2$ layer 106. In the prior art, the photoresist 48, the photoresist residue 42, the $SiO_2$ etch residue 44, the SiN etch residue 120, and the Cu etch residue 122 are removed by the plasma ashing and the stripper bath of the prior art.

Note that the fifth, sixth, and seventh residues are worst case scenarios. Depending upon a specific etch process, the fifth, sixth, or seventh residue might not be present.

Recent developments in semiconductor technology have led to proposed replacement of the second and third dielectric layers, 106 and 110, of the dual damascene structure 100 with low dielectric constant materials. Replacing the second and third dielectric layers, 106 and 110, with the low dielectric constant materials enhances an electronic device speed. Current efforts to develop the low dielectric constant materials have led to first and second categories of the low dielectric constant materials. The first category of low dielectric constant materials is a C—$SiO_2$ material in which C (carbon) lowers an $SiO_2$ dielectric constant. The second category of dielectric materials are spinon polymers, which are highly cross-linked polymers specifically designed to provide a low dielectric constant. An example of the spin-on polymers is Dow Chemical's SILK. SILK is a registered trademark of Dow Chemical.

Via and line geometries are progressing to smaller dimensions and larger depth to width ratios. As the via and line geometries progress to the smaller dimensions and larger depth to width ratios, the plasma ashing and the stripper bath of the prior art are becoming less effective at removal of photoresist and photoresist residue. Further, replacement of $SiO_2$ with low dielectric constant materials raises difficulties with continued use of the plasma ashing. For the C—$SiO_2$ material, the $O_2$ plasma attacks the C. For the C—$SiO_2$ material, the $O_2$ plasma can be replaced with a $H_2$ plasma but this reduces an overall effectiveness of the plasma ashing. For the spin-on polymers, especially Dow Chemical's SILK, the plasma ashing is not a feasible method for removing the photoresist or the photoresist residue since the plasma ashing attacks the spin-on polymers.

What is needed is a more effective method of removing photoresist.

What is needed is a more effective method of removing residue.

What is needed is a more efficient method of removing photoresist.

What is needed is a more efficient method of removing residue.

What is needed is a method of removing photoresist from a substrate in which via and line geometries have small dimensions.

What is needed is a method of removing residue from a substrate in which via and line geometries have small dimensions.

What is needed is a method of removing photoresist from a substrate in which via and line geometries have large depth to width ratios.

What is needed is a method of removing residue from a substrate in which via and line geometries have large depth to width ratios.

What is needed is a method of removing photoresist from a substrate in which features are etched into a C—$SiO_2$ low dielectric constant material.

What is needed is a method of removing residue from a substrate in which features are etched into a C—$SiO_2$ low dielectric constant material.

What is needed is a method of removing photoresist from a substrate in which features are etched into a spin-on polymer low dielectric constant material.

What is needed is a method of removing residue from a substrate in which features are etched into a spin-on polymer low dielectric constant material.

SUMMARY OF THE INVENTION

The present invention is a method of removing photoresist and residue from a substrate. Typically, the photoresist—or the photoresist and the residue, or the residue—remains on the substrate following a preceding semiconductor processing step such as ion implantation or etching. The method begins by maintaining supercritical carbon dioxide, an amine, and a solvent in contact with the substrate so that the amine and the solvent at least partially dissolve the photoresist and the residue.

Preferably, the amine is a secondary amine or a tertiary amine. More preferably, the amine is the tertiary amine. Even more preferably, the amine is selected from the group consisting of 2-(methylamino)ethanol, PMDETA, triethanolamine, triethylamine, and a mixture thereof. Most preferably, the amine is selected from the group consisting of the 2-(methylamino)ethanol, the PMDETA, the triethanolamine, and a mixture thereof. Preferably, the solvent is selected from the group consisting of DMSO, EC, NMP, acetylacetone, BLO, acetic acid, DMAC, PC, and a mixture thereof.

Next, the photoresist and the residue are removed from the vicinity of the substrate. Preferably, the method continues with a rinsing step in which the substrate is rinsed in the supercritical carbon dioxide and a rinse agent. Preferably, the rinse agent is selected from the group consisting of water, alcohol, acetone, and a mixture thereof. More preferably, the rinse agent is a mixture of the alcohol and the water. Preferably, the alcohol is selected from the group consisting of isopropyl alcohol, ethanol, and other low molecular weight alcohols. More preferably, the alcohol is the ethanol.

In a first alternative embodiment, the amine and the solvent are replaced with an aqueous fluoride. In a second alternative embodiment, the solvent is added to the aqueous fluoride of the first alternative embodiment. In a third alternative embodiment, the amine is added to the aqueous fluoride and the solvent of the second alternative embodiment.

DETAILED DESCRIPTION OF THE PREFERRED EMBODIMENT

Figure 1:
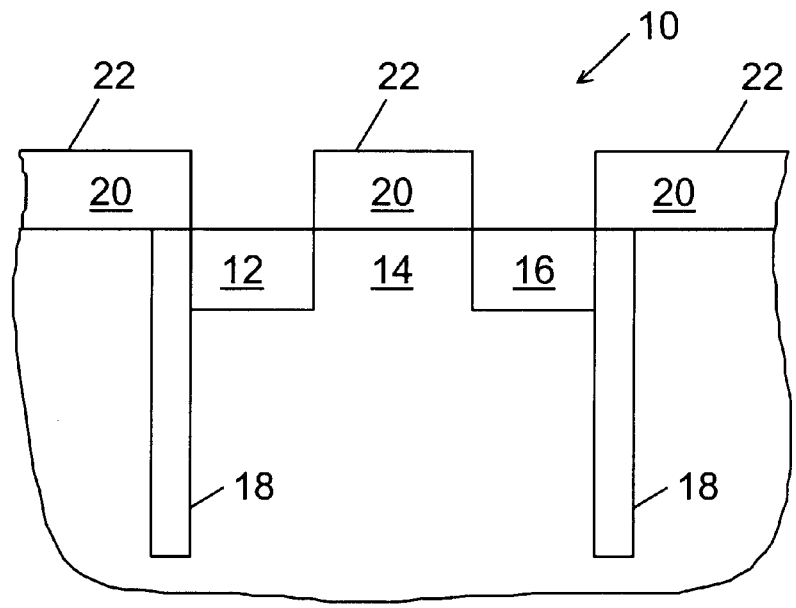
FIG. 1 illustrates an n-p-n FET structure of the prior art subsequent to an ion implantation and prior to a photoresist removal.
Figure 2:
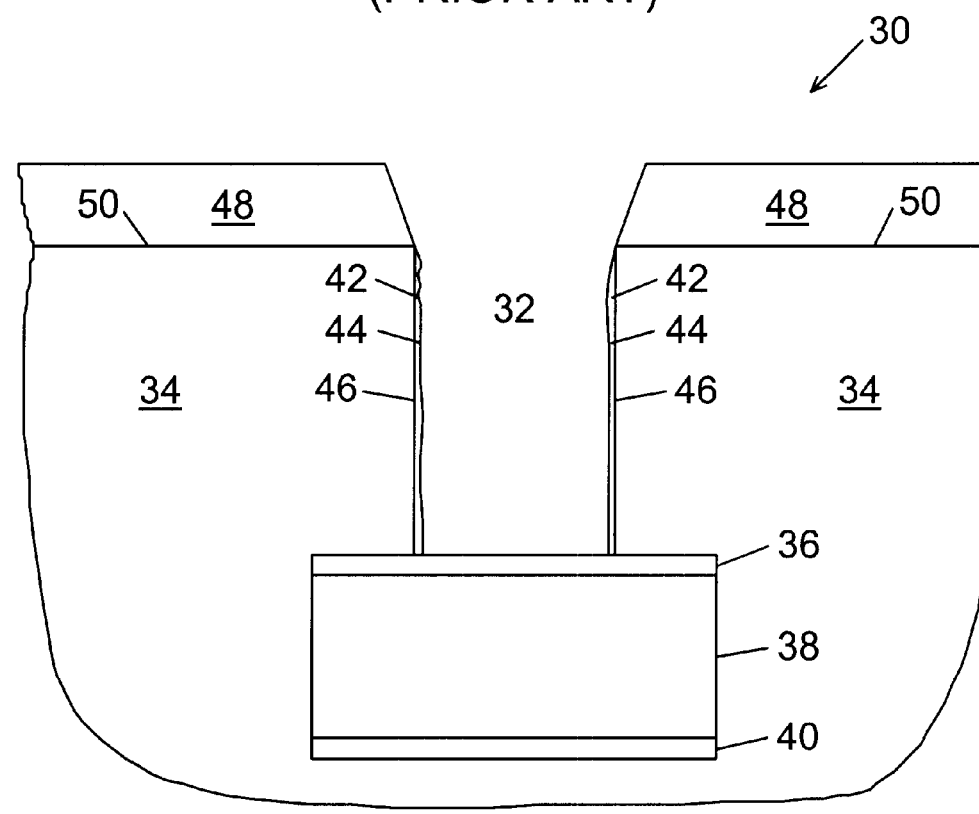
FIG. 2 illustrates a first via structure of the prior art subsequent to an RIE etch and prior to a photoresist and residue removal.
Figure 3:
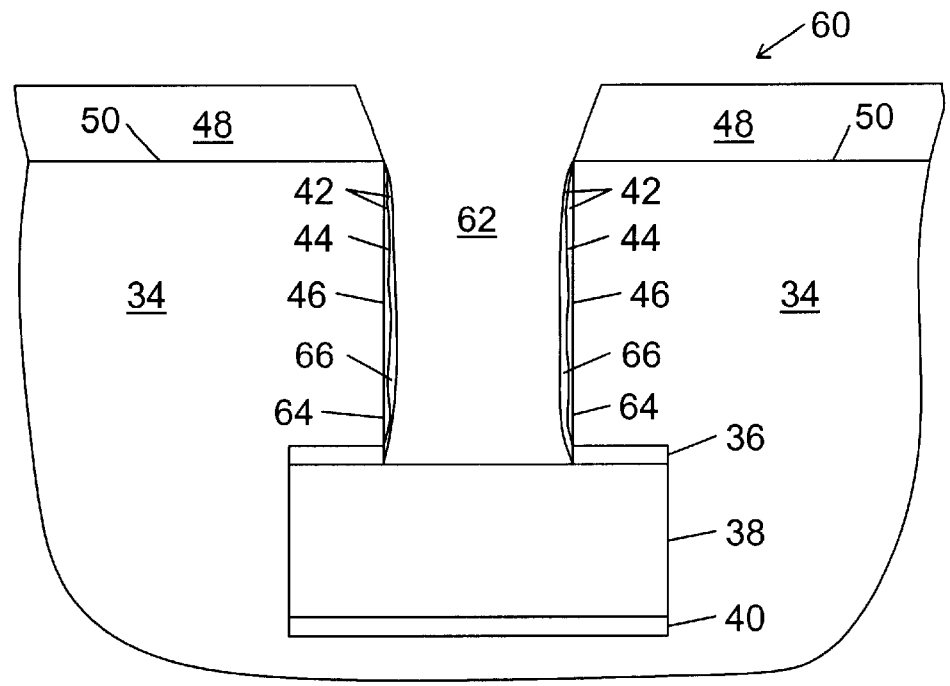
FIG. 3 illustrates a second via structure of the prior art subsequent to the RIE etch and prior to the photoresist and residue removal.
Figure 4:
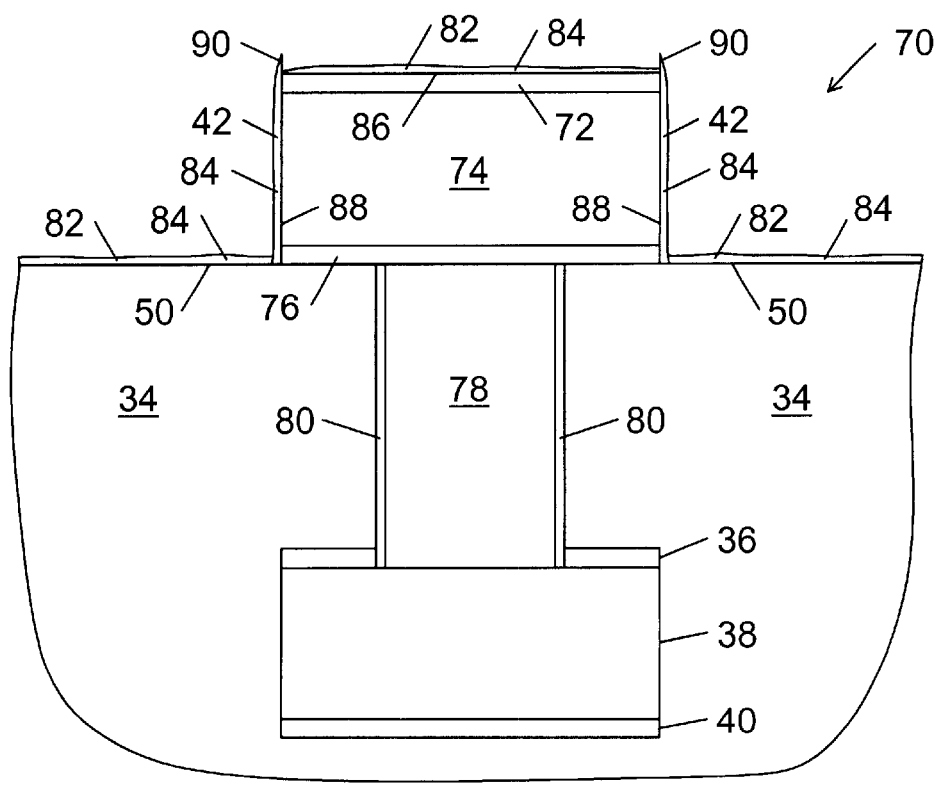
FIG. 4 illustrates a metal line structure of the prior art subsequent to the RIE etch and prior to a residue removal.
Figure 5:
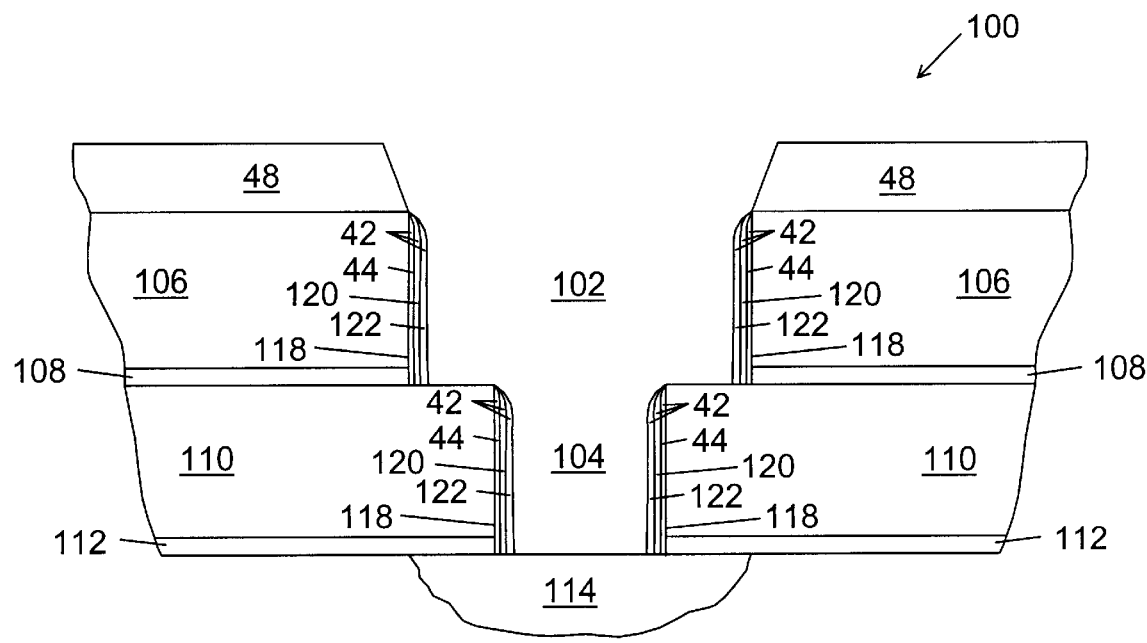
FIG. 5 illustrates a dual damascene structure of the prior art subsequent to the RIE etch and prior to the photoresist and residue removal.

The present invention is a method of removing photoresist and residue from a substrate using supercritical carbon dioxide. The residue includes photoresist residue and etch residue. Generally, the substrate is a semiconductor wafer. Alternatively, the substrate is a non-wafer substrate such as a puck. Typically, the photoresist was placed on the wafer to mask a portion of the wafer in a preceding semiconductor fabrication process step. Such preceding process steps include ion implantation and etching steps.

In the ion implantation step, the photoresist masks areas of the wafer that are not implanted with a dopant while allowing the dopant to implant the wafer in non-masked regions. The ion implantation step forms a hardened crust on the photoresist leaving a jelly-like core under the hardened crust.

In the etching step, the photoresist masks areas of the wafer that are not etched while the non-masked regions are etched. In the etching step, the photoresist and the wafer are etched producing etch features while also producing the photoresist residue and the etch residue. Etching of the photoresist produces the photoresist residue. Etching of the etch features produces the etch residue. The photoresist and etch residue generally coat sidewalls of the etch features.

In some etching steps, the photoresist is not etched to completion so that a portion of the photoresist remains on the wafer following the etching step. In these etching steps, the etching process hardens remaining photoresist. In other etching steps, the photoresist is etched to completion so no photoresist remains on the wafer in such etching steps. In the latter case only the residue, that is the photoresist residue and the etch residue, remains on the wafer.

The present invention is preferably directed to removing photoresist for 0.25 micron and smaller geometries. In other words, the present invention is preferably directed to removing I-line exposed photoresists and smaller wavelength exposed photoresists. These are UV, deep UV, and smaller geometry photoresists. Alternatively, the present invention is directed to removing larger geometry photoresists.

It will be readily apparent to one skilled in the art that while the present invention is described in terms of removing the photoresist and the residue it is equally applicable to removing the photoresist and the residue, or to removing the photoresist only, or to removing the residue only.

The preferred embodiment of the present invention removes the photoresist and the residue from the wafer using supercritical carbon dioxide, an amine, and a solvent. Preferably, the amine is selected from the group consisting of a secondary amine and a tertiary amine. More preferably the amine is the tertiary amine. Even more preferably, the amine is selected from the group consisting of 2-(methylamino)ethanol, PMDETA (pentamethyldiethylenetriamine), triethanolamine, triethylamine, and a mixture thereof. Most preferably, the amine is selected from the group consisting of 2-(methylamino)ethanol, PMDETA, triethanolamine, and a mixture thereof. Preferably, the solvent is selected from the group consisting of DMSO (dimethyl sulfoxide), EC (ethylene carbonate), NMP (N-methyl-2-pyrrolidone), acetyl acetone, BLO (butyrolactone), acetic acid, DMAC (N,N'-dimethylacetamide), PC (propylene carbonate), and a mixture thereof. More preferably, the solvent is selected from the group consisting of DMSO, EC, NMP, acetyl acetone, BLO, glacial acetic acid, and a mixture thereof.

Figure 6:
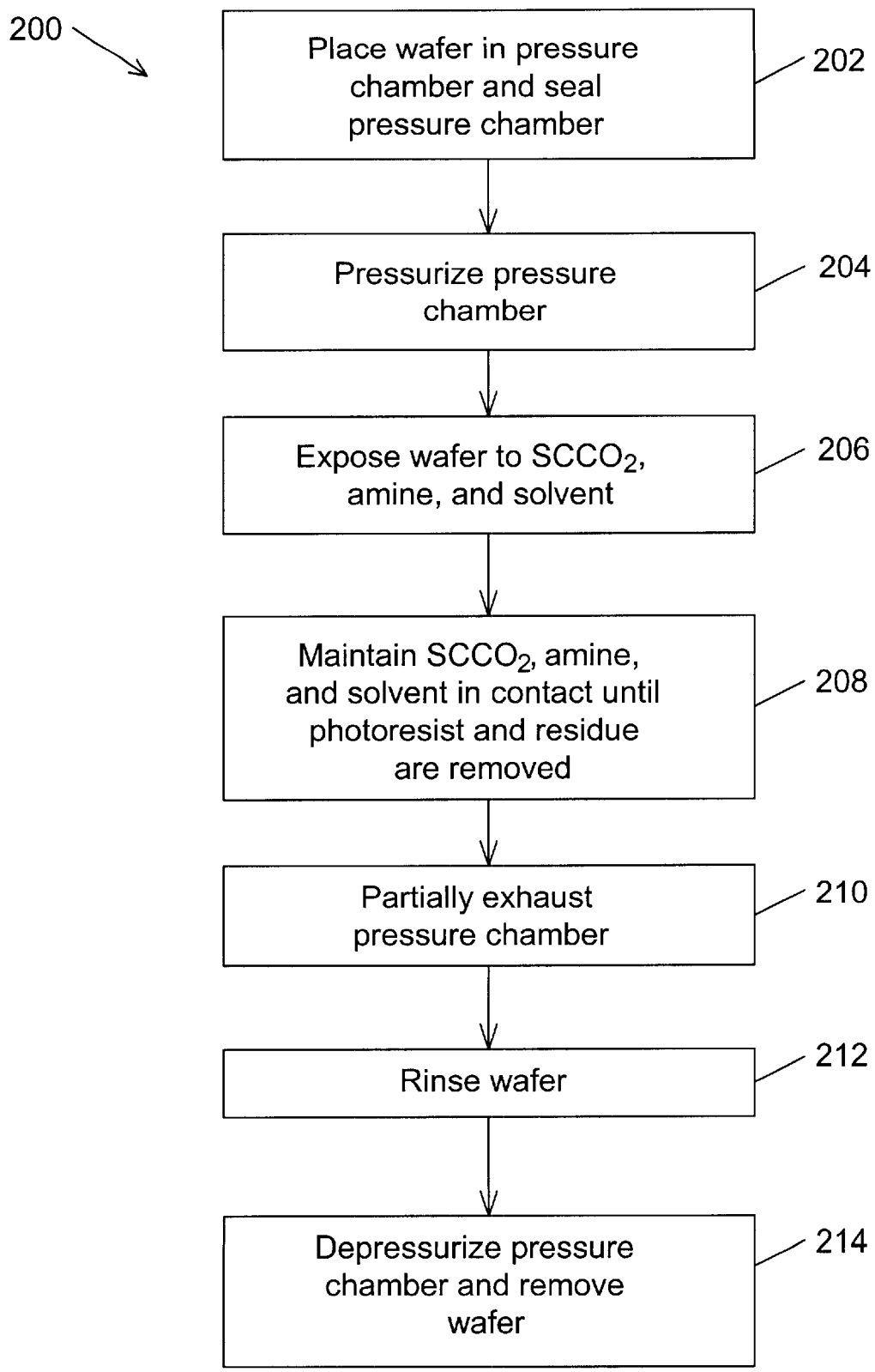
FIG. 6 is a flow chart illustrating steps of the preferred method of the present invention.

The preferred method of the present invention is illustrated as a block diagram in FIG. 6. The preferred method 200 begins by placing the wafer, with the photoresist and the residue on the wafer, within a pressure chamber and sealing the pressure chamber in a first process step 202. In a second process step 204, the pressure chamber is pressurized with carbon dioxide until the carbon dioxide becomes the supercritical carbon dioxide ($SCCO_2$). In a third process step 206, the supercritical carbon dioxide carries the amine and the solvent into the process chamber. In a fourth process step 208, the supercritical carbon dioxide, the amine, and the solvent are maintained in contact with the wafer until the photoresist and the residue are removed from the wafer. In the fourth process step 208, the amine and the solvent at least partially dissolve the photoresist and the residue. In a fifth process step 210, the pressure chamber is partially exhausted. In a sixth process step 212, the wafer is rinsed. In a seventh process step 214, the preferred method 200 ends by depressurizing the pressure chamber and removing the wafer.

Figure 7:
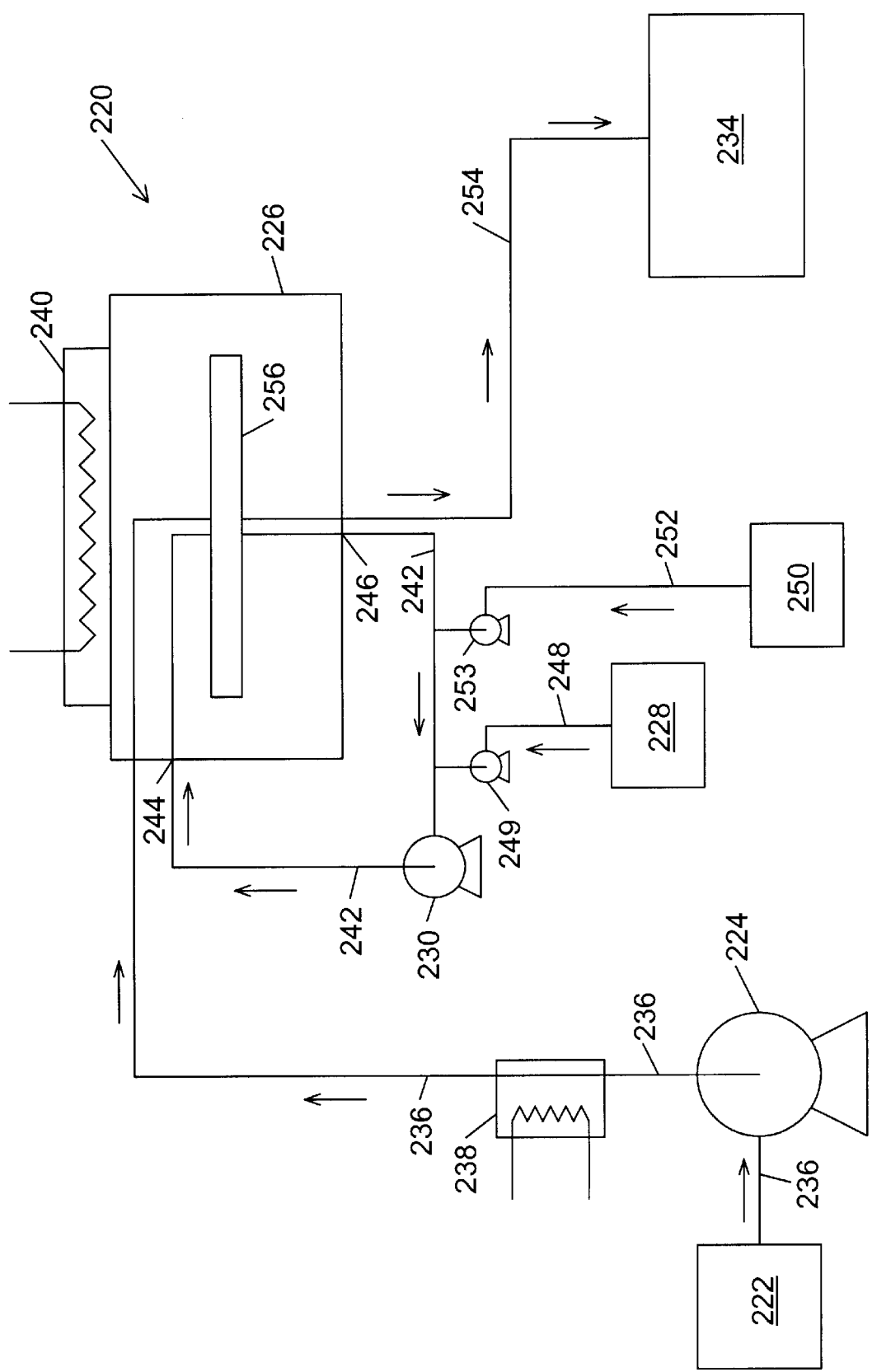
FIG. 7 illustrates the preferred processing system of the present invention.

The preferred supercritical processing system of the present invention is illustrated in FIG. 7. The preferred supercritical processing system 220 includes a carbon dioxide supply vessel 222, a carbon dioxide pump 224, the pressure chamber 226, a chemical supply vessel 228, a circulation pump 230, and an exhaust gas collection vessel 234. The carbon dioxide supply vessel 222 is coupled to the pressure chamber 226 via the carbon dioxide pump 224 and carbon dioxide piping 236. The carbon dioxide piping 236 includes a carbon dioxide heater 238 located between the carbon dioxide pump 224 and the pressure chamber 226. The pressure chamber 226 includes a pressure chamber heater 240. The circulation pump 230 is located on a circulation line 242, which couples to the pressure chamber 226 at a circulation inlet 244 and at a circulation outlet 246. The chemical supply vessel 228 is coupled to the circulation line 242 via a chemical supply line 248, which includes a first injection pump 249. A rinse agent supply vessel 250 is coupled to the circulation line 242 via a rinse supply line 252, which includes a second injection pump 253. The exhaust gas collection vessel 234 is coupled to the pressure chamber 226 via exhaust gas piping 254. It will be readily apparent to one skilled in the art that the preferred supercritical processing system 220 includes valving, control electronics, filters, and utility hookups which are typical of supercritical fluid processing systems.

It will be readily apparent to one skilled in the art that additional chemical supply vessels could be coupled to the first injection pump 249 or that the additional chemical supply vessels and additional injection pumps could be coupled to the circulation line 242.

Referring to both FIGS. 6 and 7, implementation of the preferred method 200 begins with the first process step 202, in which the wafer, having the photoresist or the residue or both the photoresist and the residue, is placed in a wafer cavity 256 of the pressure chamber 226 and, then, the pressure chamber 226 is sealed. In the second process step 204, the pressure chamber 226 is pressurized by the carbon dioxide pump 224 with the carbon dioxide from the carbon dioxide supply vessel 222. During the second step 204, the carbon dioxide is heated by the carbon dioxide heater 238 while the pressure chamber 226 is heated by the pressure chamber heater 240 to ensure that a temperature of the carbon dioxide in the pressure chamber 226 is above a critical temperature. The critical temperature for the carbon dioxide is 31° C. Preferably, the temperature of the carbon dioxide in the pressure chamber 226 is within a range of 45° C. to 75° C. Alternatively, the temperature of the carbon dioxide in the pressure chamber 226 is maintained within a range of from 31° C. to about 100° C.

Upon reaching initial supercritical conditions, the first injection pump 249 pumps the amine and the solvent from the chemical supply vessel 228 into the pressure chamber 226 via the circulation line 242 while the carbon dioxide pump further pressurizes the supercritical carbon dioxide in the third process step 206. Once a desired amount of the amine and the solvent has been pumped into the pressure chamber 226 and desired supercritical conditions are reached, the carbon dioxide pump 224 stops pressurizing the pressure chamber 226, the first injection pump 249 stops pumping the amine and the solvent into the pressure chamber 226, and the circulation pump 230 begins circulating the supercritical carbon dioxide, the amine, and the solvent in the fourth process step 208. By circulating the supercritical carbon dioxide, the amine, and the solvent, the supercritical carbon dioxide maintains the amine and the solvent in contact with the wafer. Additionally, by circulating the supercritical carbon dioxide, the amine, and the solvent, a fluid flow enhances removal of the photoresist and the residue from the wafer.

Preferably, the wafer is held stationary in the pressure chamber 226 during the fourth process step 208. Alternatively, the wafer is spun within the pressure chamber 226 during the fourth process step 208.

After the photoresist and the residue has been removed from the wafer, the pressure chamber 226 is partially depressurized by exhausting some of the supercritical carbon dioxide, the amine, the solvent, removed photoresist, and removed residue to the exhaust gas collection vessel 234 in order to return conditions in the pressure chamber 226 to near the initial supercritical conditions in the fifth process step 210.

In the sixth process step 212, the second injection pump 253 pumps a rinse agent from the rinse agent supply vessel 250 into the pressure chamber 226 via the circulation line while the carbon dioxide pump 224 pressurizes the pressure chamber 226 to near the desired supercritical conditions and, then, the circulation pump 230 circulates the supercritical carbon dioxide and the rinse agent in order to rinse the wafer. Preferably, the rinse agent is selected from the group consisting of water, alcohol, acetone, and a mixture thereof. More preferably, the rinse agent is the mixture of the alcohol and the water. Preferably, the alcohol is selected from the group consisting of isopropyl alcohol, ethanol, and other low molecular weight alcohols. More preferably, the alcohol is selected from the group consisting of the isopropyl alcohol and the ethanol. Most preferably, the alcohol is the ethanol.

Preferably, the wafer is held stationary in the pressure chamber 226 during the sixth process step 212. Alternatively, the wafer is spun within the pressure chamber 226 during the sixth process step 212.

In the seventh process step 214, the pressure chamber 226 is depressurized, by exhausting the pressure chamber 226 to the exhaust gas collection vessel 234 and, finally, the wafer is removed from the pressure chamber 226.

Figure 8:
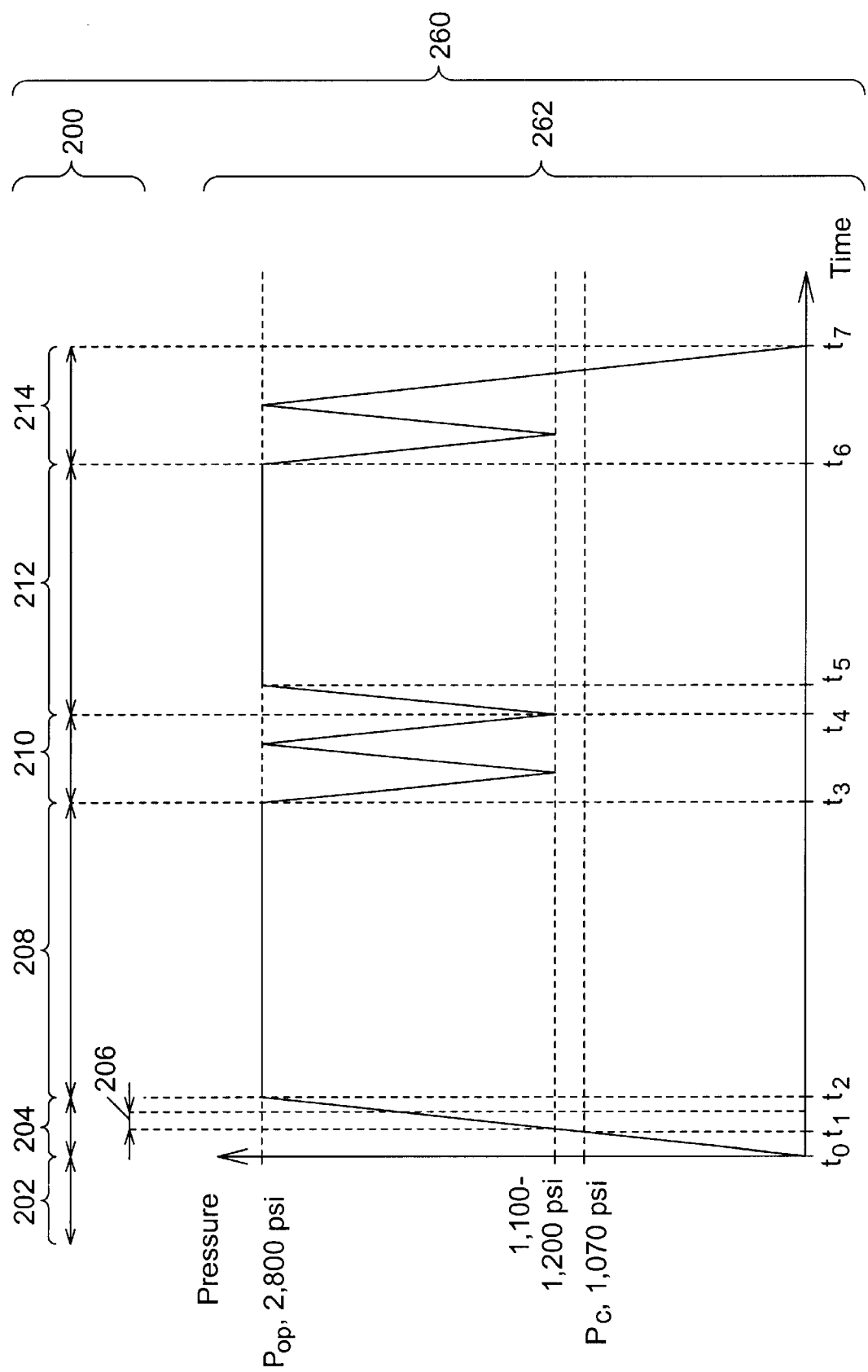
FIG. 8 is the preferred timeline of the present invention.

The preferred timeline of the present invention is graphically illustrated in FIG. 8. The preferred timeline 260 indicates the preferred method 200 as a function of time and also indicates pressure 262 as a function of the time. It will be readily apparent to one skilled in the art that the time axis in FIG. 8 is only illustrative and as such does not indicate relative time periods to scale. Ideally, of course, all times would be minimized within reason to obtain an economical and efficient processing method.

Prior to an initial time to, the wafer is placed within the pressure chamber 226 and the pressure chamber is sealed in the first process step 202. From the initial time to through a first time $t_1$ to a second time $t_2$, the pressure chamber 226 is pressurized in the second process step 204. The pressure chamber reaches critical pressure $P_c$ at the first time $t_1$. The critical pressure $P_c$ for the supercritical carbon dioxide is 1,070 psi. Preferably, the amine and the solvent are injected into the pressure chamber 226 between the first time $t_1$ and the second time $t_2$ in the third process step 206. Preferably, an amine and solvent injection begins upon reaching about 1100–1200 psi. Alternatively, the amine and the solvent are injected into the pressure chamber around the second time $t_2$ or after the second time $t_2$. The pressure chamber reaches an operating pressure $P_{op}$ at the second time $t_2$. Preferably, the operating pressure $P_{op}$ is about 2,800 psi. Alternatively, the operating pressure $P_{op}$ is within the range of from 1,070 psi to about 6,000 psi.

The preferred timeline 260 continues in the fourth process step 208 with maintaining the supercritical carbon dioxide, the amine, and the solvent in contact with the wafer until the photoresist and the residue are removed from the wafer, which takes place from the second time $t_2$ to a third time $t_3$. In the fifth process step 210, the pressure chamber 226 is partially exhausted from the third time $t_3$ to a fourth time $t_4$. Preferably, this is accomplished by dropping from the operating pressure $P_{op}$ to about the 1,100–1,200 psi in a first exhaust, raising from the 1,100–1,200 psi to the operating pressure $P_{op}$ in a first pressure recharge, and dropping again to the 1,100–1,200 psi in a second exhaust. Alternatively, the pressure recharge and the second exhaust are not performed as part of the fifth process step 210. Further alternatively, additional recharges and exhausts are performed as part of the fifth process step 210 where one or more of the exhausts can be a full exhaust.

The preferred timeline 260 continues in the sixth process step 212 with rinsing of the wafer from the fourth time $t_4$ through a fifth time $t_5$ to a sixth time $t_6$. The sixth process step 212 begins with a second pressure recharge during which the rinse agent is preferably injected into the pressure chamber 226 from the fourth time $t_4$ to the fifth time $t_5$. In the seventh process step 214, the pressure chamber 226 is exhausted from the sixth time $t_6$ to a seventh time $t_7$. Preferably, this is accomplished by dropping the operating pressure $P_{op}$ to about the 1,100–1,200 psi in a third exhaust, raising from the 1,100–1,200 psi to the operating pressure $P_{op}$ in a third pressure recharge, and finally dropping to atmospheric pressure in a final exhaust. Alternatively, the third exhaust and the third pressure recharge are not performed as part of the seventh process step 214. Further alternatively, additional exhausts and recharges are performed as part of the seventh process step 210.

A first alternative embodiment of the present invention adds an aqueous fluoride to the preferred embodiment. In the first alternative embodiment, the supercritical carbon dioxide, the amine, the solvent, and the aqueous fluoride remove the photoresist and the residue. Preferably, the aqueous fluoride is selected from the group of fluoride bases and fluoride acids. More preferably, the aqueous fluoride is selected from the group consisting of aqueous ammonium fluoride (aqueous $NH_4F$), and aqueous hydrofluoric acid (HF).

The first alternative embodiment is useful when at least a portion of the photoresist or a portion of the residue is removed from a silicon dioxide ($SiO_2$) surface. The aqueous fluoride undercuts the $SiO_2$ surface from the photoresist and the residue by slightly etching the $SiO_2$ surface. While the aqueous fluoride is useful in removing the photoresist or the residue form the $SiO_2$ surface of the wafer, the aqueous fluoride cannot be used when the wafer includes an exposed aluminum layer. This is because the aqueous fluoride will rapidly etch the exposed aluminum layer.

A second alternative embodiment of the present invention adds additional water to the first alternative embodiment. The additional water enhances the first alternative embodiment because the photoresist is hydrophillic while the $SiO_2$ surface is hydrophobic. Thus, the additional water separates the photoresist from the $SiO_2$ surface.

A third alternative embodiment of the present invention uses the supercritical carbon dioxide and the aqueous fluoride to remove the photoresist and residue. In the third alternative embodiment, the amine is not used and the solvent is not used.

A fourth alternative embodiment of the present invention adds the additional water to the supercritical carbon dioxide and the aqueous fluoride.

A fifth alternative embodiment of the present invention adds the solvent to the third alternative embodiment.

In a first alternative timeline, the fourth process step 208 is performed at an initial cleaning pressure and a final cleaning pressure. Preferably, the initial cleaning pressure is about the 1,100–1,200 psi and the final cleaning pressure is about the 2,800 psi. At the initial cleaning pressure, a first solubility of some of the chemicals is lower than a second solubility at the final cleaning pressure. During an initial cleaning phase which takes place at the initial cleaning pressure, lower solubility chemicals condense on the wafer. This provides greater concentration of the lower solubility chemicals on the photoresist and the residue and, thus, enhances separation of the photoresist and the residue from the wafer. During a final cleaning phase which takes place at the final cleaning pressure, the lower solubility chemicals either no longer condense or condense less on the wafer and, thus, concentration of the lower solubility chemicals on the wafer is reduced in anticipation of finishing the fourth process step 208.

In a second alternative timeline of the present invention, a second rinse is performed after performing the first rinse.

Specific Embodiments

First through seventh specific embodiments of the present invention are discussed below. Each of the first through seventh specific embodiments is a summary of a specific chemistry and a specific method employed in a lab system, similar to the preferred supercritical processing system 220. The lab system was used to remove the photoresist, or to remove the photoresist and the residue, or to remove the residue from test wafers. The lab system featured a combined internal volume for the pressure chamber 226, the circulation pump 230, and the circulation line 242 of about 1.8 liters. The first through seventh specific embodiments were performed as part of a proof-of-concept feasibility study intended to show feasibility of the present invention for use in semiconductor fabrication. Before an incorporation of the present invention in the semiconductor fabrication, it is envisioned that further process refinements would be made.

First Specific Embodiment

In the first specific embodiment, the photoresist and the residue were removed from an $SiO_2$ via structure formed in a preceding via etching step, where the etching step ended upon reaching an aluminum etch stop. The specific chemistry employed was as follows: 2 ml of 2-methyl amino ethanol (the amine), 20 ml of DMSO (a first component of the solvent), and 20 ml of EC (a second component of the solvent). The pressure chamber was maintained at 50° C. The amine and the solvent were circulated for 5 minutes at 2,800 psi. Two partial exhausts and one full exhaust were employed between the removal and rinse steps in which the pressure was dropped from the 2,700 psi to 1,100 psi for the partial exhausts and the pressure was dropped from 2,700 psi to atmospheric pressure in the full exhaust. The rinse agent for the rinse step was 56 ml of the acetone. The rinse agent and the supercritical carbon dioxide were circulated for 5 minutes. One partial exhaust was performed prior to performing a complete exhaust following the rinse step.

Figure 9:
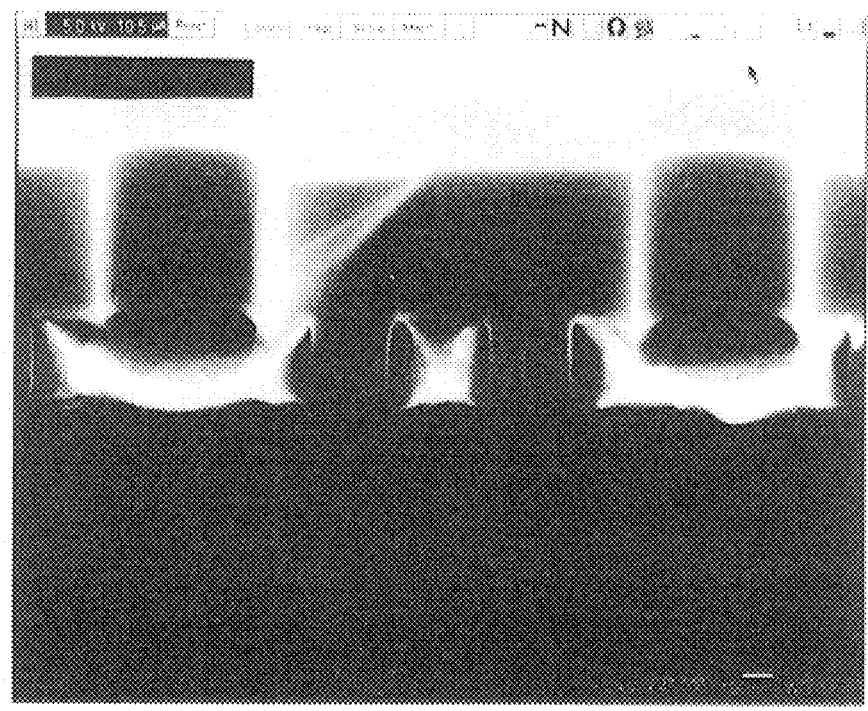
FIG. 9 is a first SEM photo of a via structure taken after the photoresist and residue removal in a first specific embodiment of the present invention.

FIG. 9 is a first SEM photo taken subsequent to removal of the photoresist and the residue in the first specific embodiment. The first SEM photo shows that the photoresist and the residue were removed in the first specific embodiment.

Second Specific Embodiment

In the second specific embodiment, the residue, including the photoresist residue and the etch residue, was removed from a metal line structure formed in a preceding metal line etching step, where the etching step ended upon reaching an oxide etch stop. (The test wafer for the second specific embodiment was provided courtesy of Lucent Technologies.) The specific chemistry employed was as follows: 1.5 ml of PMDETA (the amine), 7.5 ml of NMP (the first component of the solvent), and 6 ml of acetyl acetone (the second component of the solvent). The pressure chamber was maintained at 50° C. The amine and the solvent were circulated for 2 minutes at 2,800 psi. One partial exhaust and one full exhaust were employed between the removal and the rinse steps. The rinse agent for the rinse step was 20 ml of an 80% ethanol and 20% water mixture, by volume. The rinse agent and the supercritical carbon dioxide were circulated for 1 minute. A complete exhaust was performed following the rinse step.

Figure 10A:
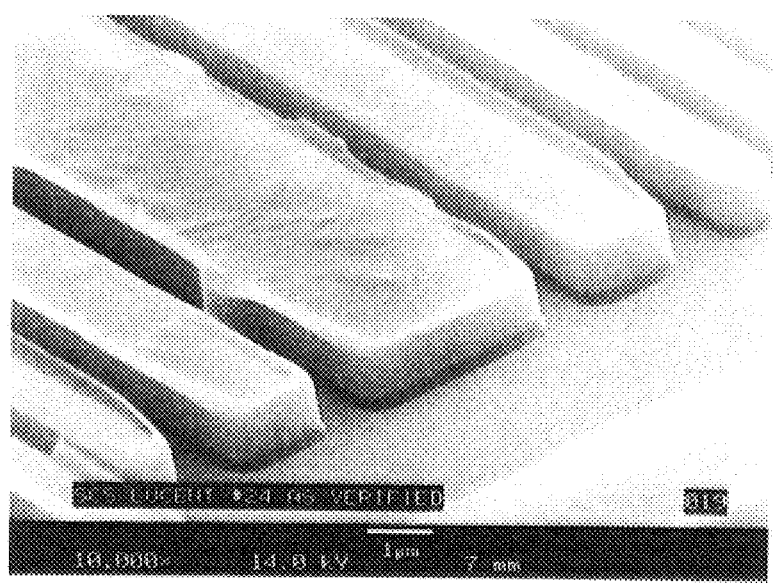
FIGS. 10A through 10C are second through fourth SEM photos of a metal line structure where the second SEM photo was taken before a residue removal and the third and fourth SEM photos were taken after the residue removal in a second specific embodiment of the present invention.
Figure 10B:
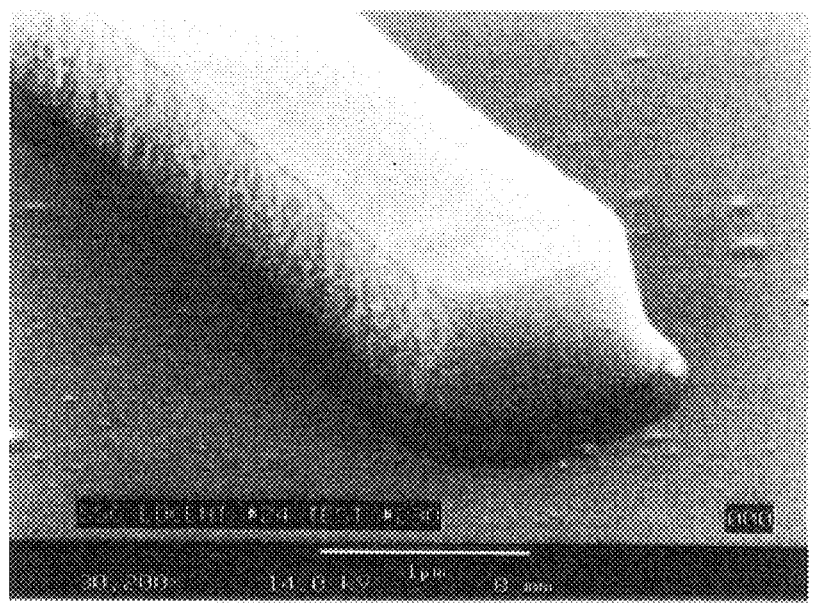
Figure 10C:
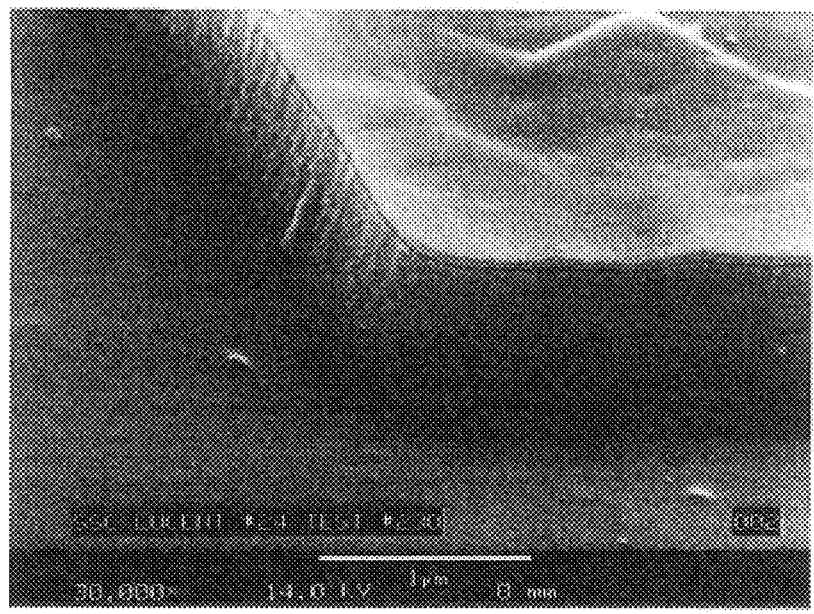

FIG. 10A is a second SEM photo taken prior to removal of the residue in the second specific embodiment. The second SEM photo shows the residue on sidewalls of metal lines, shows skirts of the residue protruding above the metal lines, and shows the residue remaining on tops of the metal lines. FIGS. 10B and 10C are third and fourth SEM photos taken subsequent to removal of the residue in the second specific embodiment. The third and fourth SEM photos show that the residue was removed in the second specific embodiment.

Third Specific Embodiment

In the third specific embodiment, the photoresist was removed from a wafer following a medium dose ion implant. The specific chemistry employed was as follows: 0.15 ml of 24% by volume aqueous ammonium fluoride (the aqueous fluoride), 20 ml of BLO (the first component of the solvent), 20 ml of DMSO (the second component of the solvent), 0.15 ml of glacial acetic acid (a third component of the solvent), and 1 ml of additional water. The pressure chamber was maintained at 70° C. The aqueous fluoride and the solvent were circulated for 2 minutes at 1,250 psi after which the pressure chamber was pressurized to 2,800 psi. Two partial exhausts and one full exhaust were employed between the removal and rinse steps in which the pressure was dropped from the 2,700 psi to 1,100 psi for the partial exhausts and the pressure was dropped from 2,700 psi to atmospheric pressure in the full exhaust. The rinse agent for the rinse step was 20 ml of a mixture of 80% ethanol and 20% water. The rinse agent and the supercritical carbon dioxide were circulated for 1 minute. One partial exhaust was performed prior to performing a complete exhaust following the rinse step.

Before and after XPS (x-ray photoelectron spectroscopy) tests demonstrated that the photoresist was removed in the third specific embodiment.

Fourth Specific Embodiment

In the fourth specific embodiment, the photoresist was removed from a wafer following a high dose ion implant. The specific chemistry employed was as follows: 0.22 ml of 24% by volume aqueous ammonium fluoride (the aqueous fluoride), 20 ml of DMSO (a first component of the solvent), 20 ml of EC (a second component of the solvent), and 2 ml of the additional water. The pressure chamber was maintained at 70° C. The aqueous fluoride and the solvent were circulated for 2 minutes at 2,800 psi. Two partial exhausts and one full exhaust were employed between the removal and rinse steps in which the pressure was dropped from the 2,700 psi to 1,100 psi for the partial exhausts and the pressure was dropped from 2,700 psi to atmospheric pressure in the full exhaust. The rinse agent for the rinse step was 20 ml of a mixture of 80% ethanol and 20% water. The rinse agent and the supercritical carbon dioxide were circulated for 1 minute. One partial exhaust was performed prior to performing a complete exhaust following the rinse step.

Before and after XPS tests demonstrated that the photoresist was removed in the fourth specific embodiment.

Fifth Specific Embodiment

In the fifth specific embodiment, the photoresist was removed from an $SiO_2$ via structure formed in a preceding via etching step, where the etching step ended upon reaching a TiN etch stop. The specific chemistry employed was as follows: 0.15 ml of 24% by volume aqueous ammonium fluoride (the aqueous fluoride) and 8 ml of additional water. The pressure chamber was maintained at 50° C. The aqueous fluoride and the additional water were circulated for 2 minutes at 1,500 psi. Two partial exhausts and one full exhaust were employed between the removal step and the first rinse step in which the pressure was dropped from the 1,500 psi to 1,050 psi for the partial exhausts and the pressure was dropped from 1,500 psi to atmospheric pressure in the full exhaust.

The rinse agent for the first rinse step was 12 ml of water. In the first rinse step, the rinse agent and the supercritical carbon dioxide were circulated for 1 minute at 1,500 psi following which the pressure was raised to 2,800 psi. Two partial exhausts and one full exhaust were employed between the first rinse step and the second rinse step in which the pressure was dropped from the 2,800 psi to 1,100 psi for the partial exhausts and the pressure was dropped from 2,800 psi to atmospheric pressure in the full exhaust. The rinse agent for the second rinse was 20 ml of methanol. In the second rinse step, the rinse agent and the supercritical carbon dioxide were circulated for 1 minute at the 2,800 psi. One partial exhaust was performed prior to performing a complete exhaust following the second rinse step.

Figure 11A:
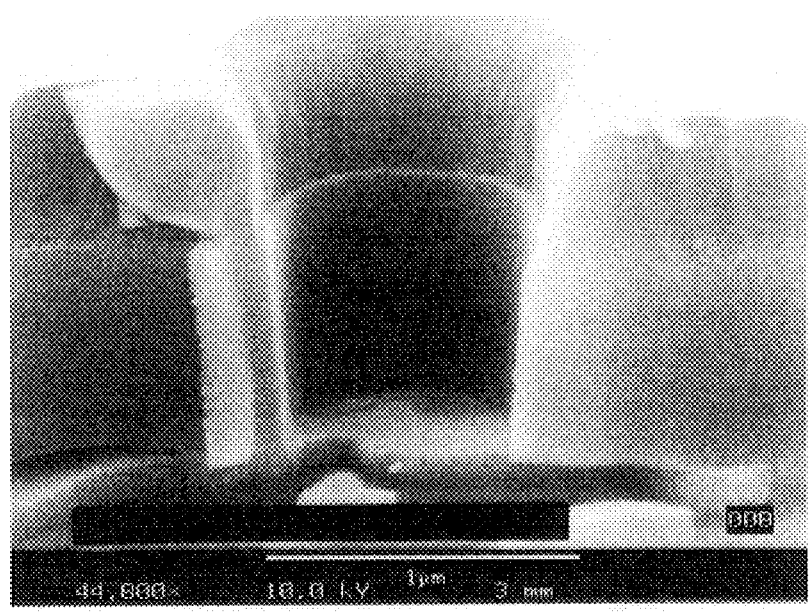
FIGS. 11A and 11B are fifth and sixth SEM photos of a $SiO_2$ via structure where the fifth SEM photo was taken before a photoresist removal and the sixth SEM photo was taken after the photoresist removal in a fifth specific embodiment of the present invention.
Figure 11B:
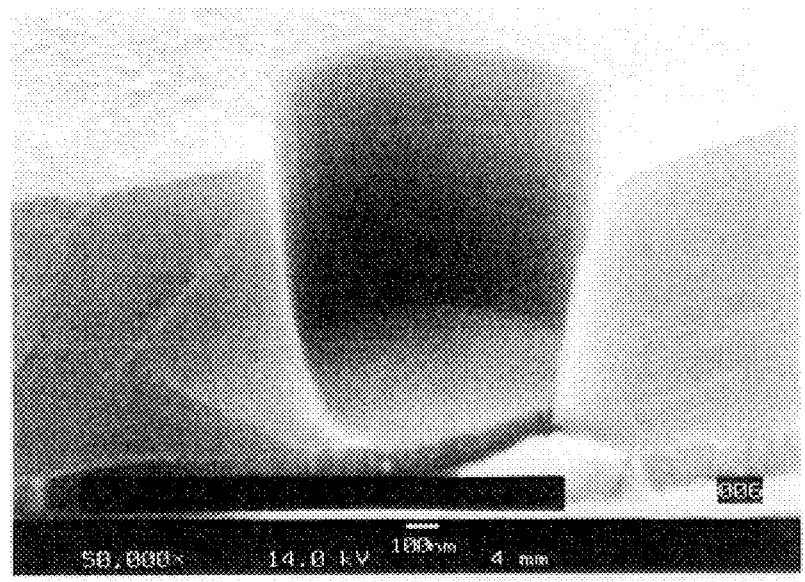

FIG. 11A is a fifth SEM photo taken prior to removal of the photoresist in the fifth specific embodiment. The fifth SEM photo shows the photoresist above the $SiO_2$ via structure and the TiN etch stop at a bottom of the via. FIG. 11B is a sixth SEM photo taken subsequent to removal of the photoresist in the fifth specific embodiment. The sixth SEM photo shows that the photoresist was removed in the fifth specific embodiment.

Sixth Specific Embodiment

In the sixth specific embodiment, the photoresist was removed from an $SiO_2$ via structure formed in a preceding via etching step. The specific chemistry employed was as follows: 1.5 ml of 24% by volume aqueous ammonium fluoride (the aqueous fluoride), and 8 ml of DMSO (the solvent) and 4 ml of additional water. The pressure chamber was maintained at 50° C. The aqueous fluoride, the solvent, and the additional water were circulated for 2 minutes at 2,800 psi. One partial exhaust and one full exhaust were employed between the removal step and the rinse step. The rinse agent was 20 ml of 80% ethanol and 20% water. The rinse agent and the supercritical carbon dioxide were circulated for 1 minute at 2,700 psi. One partial exhaust was performed prior to performing a complete exhaust following the rinse step.

Figure 12:
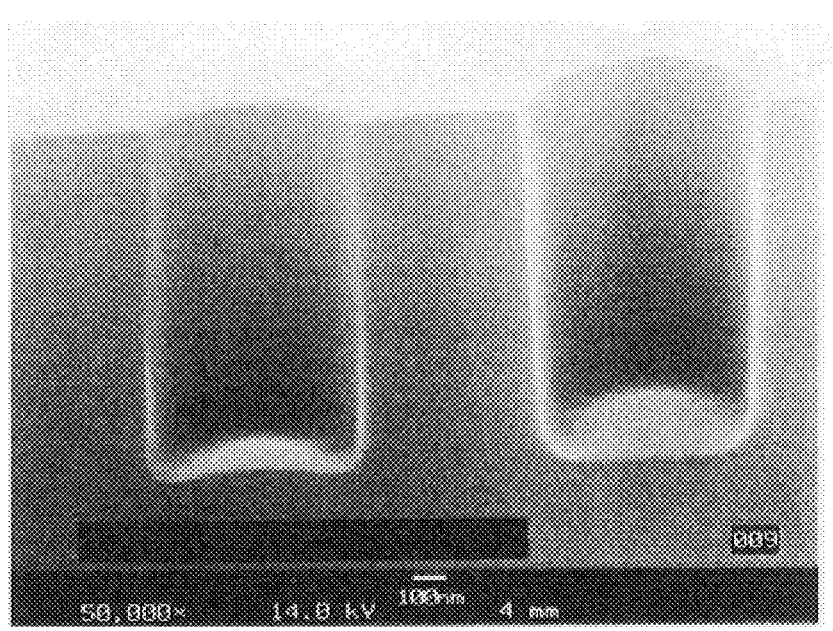
FIG. 12 is a seventh SEM photo of a second $SiO_2$ via structure taken after the photoresist removal in a sixth specific embodiment of the present invention.

FIG. 12 is a seventh SEM photo taken subsequent to removal of the photoresist in the sixth specific embodiment. The seventh SEM photo shows that the photoresist was removed in the sixth specific embodiment.

Seventh Specific Embodiment

In the seventh specific embodiment, the photoresist and the residue were removed from a C—$SiO_2$ damascene structure formed in a preceding via etching step. The specific chemistry employed was as follows: 0.15 ml of 24% by volume aqueous ammonium fluoride (the aqueous fluoride), 20 ml of BLO (the first component of the solvent), 20 ml of DMSO (the second component of the solvent), 0.15 ml of glacial acetic acid (the third component of the solvent), and 1 ml of additional water. The pressure chamber was maintained at 70° C. The aqueous fluoride, the solvent, and the additional water were circulated for 2 minutes at 2,800 psi. Two partial exhausts and one full exhaust were employed between the removal step and the rinse step. The rinse agent for the rinse step was 20 ml of 50% ethanol and 50% water. The rinse agent and the supercritical carbon dioxide were circulated for 1 minute at 2,700 psi. One partial exhaust was performed prior to performing a complete exhaust following the rinse step.

Figure 13:
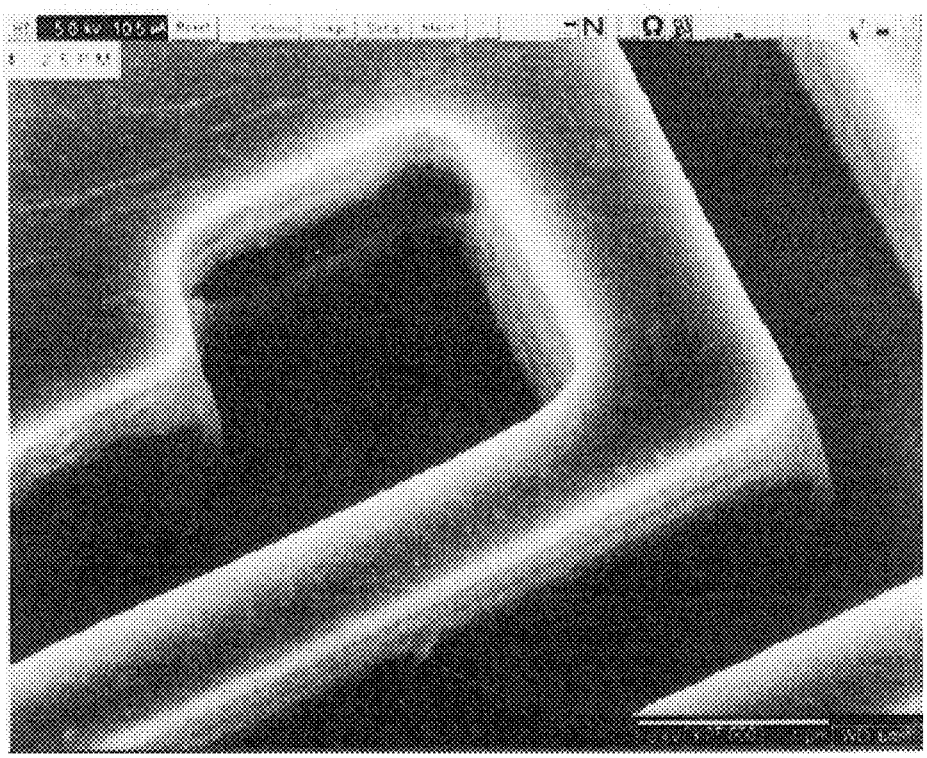
FIG. 13 is an eighth SEM photo of a C—$SiO_2$ damascene structure following the photoresist and residue removal in a seventh specific embodiment of the present invention.

FIG. 13 is an eighth SEM photo taken subsequent to removal of the photoresist and residue in the seventh specific embodiment. The eighth SEM photo shows that the photoresist and the residue were removed in the seventh specific embodiment.

It will be readily apparent to one skilled in the art that other various modifications may be made to the preferred embodiment without departing from the spirit and scope of the invention as defined by the appended claims.

What is claimed is:

1. A method of processing a substrate comprising the steps of:
   a. maintaining supercritical carbon dioxide and an aqueous fluoride in contact with the substrate, the substrate having a silicon dioxide surface which supports a material selected from the group consisting of photoresist, photoresist residue, etch residue, and a combination thereof, such that the aqueous fluoride undercuts the silicon dioxide surface from the material, whereby the material becomes undercut material;
   b. maintaining water and the supercritical carbon dioxide in contact with the undercut material such that the undercut material separates from the silicon dioxide surface, whereby the undercut material becomes separated material; and
   c. removing the separated material from the vicinity of the substrate.

2. The method of claim 1 wherein the aqueous fluoride is selected from the group consisting of aqueous ammonium fluoride, hydrofluoric acid, and a mixture thereof.

3. The method of claim 2 wherein the aqueous fluoride is the aqueous ammonium fluoride.

4. The method of claim 1 wherein the step of removing the separated material from the vicinity of the substrate comprises flowing supercritical carbon dioxide over the substrate.

5. The method of claim 1 further comprising the step of at least partially dissolving the undercut material using a solvent.

6. The method of claim 5 wherein the solvent is selected from the group consisting of BLO, DMSO, acetic acid, EC, DMAC, NMP, and a mixture thereof.

7. The method of claim 6 wherein the solvent is selected from the group consisting of the BLO, the DMSO, the acetic acid, the EC, and a mixture thereof.

8. The method of claim 7 wherein the solvent is the BLO.

9. The method of claim 1 further comprising the step of at least partially dissolving the separated material using a solvent.

10. The method of claim 9 wherein the solvent is selected from the group consisting of BLO, DMSO, acetic acid, EC, DMAC, NMP, and a mixture thereof.

11. The method of claim 10 wherein the solvent is selected from the group consisting of the BLO, the DMSO, the acetic acid, the EC, and a mixture thereof.

12. The method of claim 11 wherein the solvent is the BLO.

13. The method of claim 1 further comprising the step of rinsing the substrate in the supercritical carbon dioxide and a rinse agent.

14. The method of claim 13 wherein the rinse agent comprises water.

15. The method of claim 13 wherein the rinse agent comprises alcohol.

16. The method of claim 15 wherein the alcohol comprises ethanol.

17. The method of claim 13 wherein the rinse agent comprises acetone.

18. The method of claim 1 wherein the substrate comprises a low dielectric constant material.

19. The method of claim 18 wherein the low dielectric constant material comprises a spin-on polymer.

20. The method of claim 18 wherein the low dielectric constant material comprises a $C-SiO_2$ material.

21. A method of removing a material from a silicon dioxide surface, the material selected from the group consisting of photoresist, photoresist residue, etch residue, and a combination thereof, the method comprising the steps of:
   a. maintaining supercritical carbon dioxide and an aqueous fluoride in contact with the material and the silicon dioxide surface such that the aqueous fluoride undercuts the silicon dioxide surface from the material;
   b. maintaining water and the supercritical carbon dioxide in contact with the material such that the material separates from the silicon dioxide surface; and
   c. removing the material from the vicinity of the silicon dioxide surface.

22. A method of processing a substrate comprising the steps of:
   a. maintaining supercritical carbon dioxide, an amine, and a solvent in contact with a material on a surface of the substrate, the material selected from the group consisting of a photoresist, a photoresist residue, an etch residue, and a combination thereof, such that the amine and the solvent at least partially dissolve the material; and
   b. removing the material from the vicinity of the substrate.

23. The method of claim 22 wherein the amine comprises a secondary amine.

24. The method of claim 22 wherein the amine comprises a tertiary amine.

25. The method of claim 24 wherein the tertiary amine is selected from the group consisting of 2-methyl amino ethanol, PMDETA, triethanol amine, triethyl amine, and a mixture thereof.

26. The method of claim 25 wherein the amine is selected from the group consisting of 2-methyl amino ethanol, the PMDETA, the triethanol amine, and a mixture thereof.

27. The method of claim 22 wherein the solvent is selected from the group consisting of DMSO, EC, NMP, acetyl acetone, BLO, acetic acid, DMAC, PC, and a mixture thereof.

28. The method of claim 22 wherein the amine is selected from the group consisting of a secondary amine, a tertiary amine, di-isopropyl amine, tri-isopropyl amine, diglycol amine, and a mixture thereof.

29. The method of claim 22 further comprising the step of rinsing the substrate in the supercritical carbon dioxide and a rinse agent.

30. The method of claim 29 wherein the rinse agent comprises water.

31. The method of claim 29 wherein the rinse agent comprises alcohol.

32. The method of claim 31 wherein the alcohol comprises ethanol.

33. The method of claim 29 wherein the rinse agent comprises acetone.

34. A method of processing a substrate having a material on a surface of the substrate, the material selected from the group consisting of a photoresist, a photoresist residue, an etch residue, and a combination thereof, the method comprising the steps of:

a. maintaining supercritical carbon dioxide, an amine, and a solvent in contact with the material such that the amine and the solvent at least partially dissolve the material; and b. removing the material from the vicinity of the substrate.

35. A method of processing a substrate comprising the steps of:

a. maintaining supercritical carbon dioxide, a tertiary amine, and a solvent in contact with a material on a surface of the substrate, the material selected from the group consisting of a photoresist, a photoresist residue, an etch residue, and a combination thereof, such that the material is at least partially dissolved; and b. removing the material from the vicinity of the substrate.

* * * * *